United States Patent [19]

Vuillermoz et al.

[11] Patent Number: 5,300,455
[45] Date of Patent: Apr. 5, 1994

[54] PROCESS FOR PRODUCING AN ELECTRICALLY CONDUCTIVE DIFFUSION BARRIER AT THE METAL/SILICON INTERFACE OF A MOS TRANSISTOR

[75] Inventors: Bernard Vuillermoz, Grenoble; Mouloud Bakli, Meylan; Alain Straboni, Eybens, all of France

[73] Assignee: France Telecom, Paris, France

[21] Appl. No.: 805,839

[22] Filed: Dec. 13, 1991

[30] Foreign Application Priority Data

Dec. 13, 1990 [FR] France ................................ 90 15615

[51] Int. Cl.$^5$ .................... H01L 21/441; H01L 21/324
[52] U.S. Cl. ..................................... 437/190; 437/192; 437/247
[58] Field of Search ................. 437/190, 247, 192, 195

[56] References Cited

U.S. PATENT DOCUMENTS 4,847,111 7/1989 Chow et al. .

OTHER PUBLICATIONS

Extended Abstracts, vol. 86-2, Oct. 19, 1986, Princeton, N.J., p. 479, J. Amouroux, et al.: "Silicon and Titanium Nitriding by an H.F. NH3 Low Pressure Plasma".

Primary Examiner—John S. Maples
Attorney, Agent, or Firm—Larson and Taylor

[57] ABSTRACT

An integrated circuit such as a MOS transistor, having an electrically conductive diffusion barrier at the metal/silicon interface and a method of manufacture therefor is disclosed. The metal/silicon interface is formed by selective metal deposition onto silicon. According to the method, the interface is subjected to a nitrogen-based plasma during a period of at least five minutes. The interface is brought to a temperature greater than 500° C. during this period, in order to create a diffusion barrier comprising a silicon nitride layer. The interface is then subjected to an annealing treatment under a neutral atmosphere so as to remove the nitrogen previously introduced into the metal. The diffusion barrier forms a linking and protecting interface between each source drain or gate zone of the MOS transistor and the corresponding layer of metal covering the latter.

5 Claims, 2 Drawing Sheets

MOS TRANSISTOR BEFORE SELECTIVE W DEPOSITION

SELECTIVE W DEPOSITION (ON Si AND NOT ON SiO2)

CREATION OF THE CONDUCTIVE BARRIER

REMOVAL OF NITROGEN FROM W (ANNEAL)

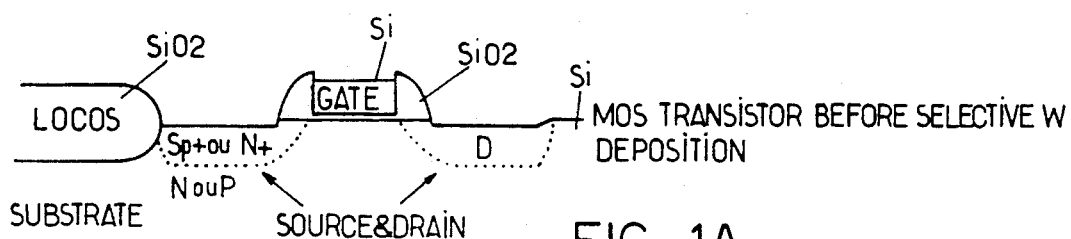
FIG. 1A — MOS TRANSISTOR BEFORE SELECTIVE W DEPOSITION
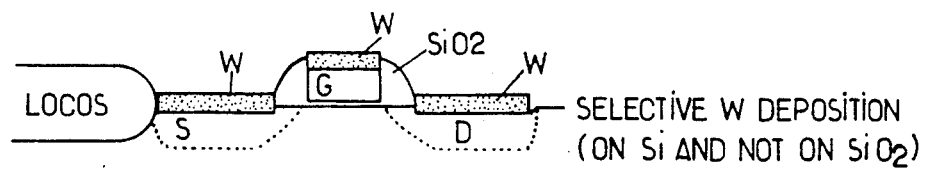
FIG. 1B — SELECTIVE W DEPOSITION (ON Si AND NOT ON $SiO_2$)
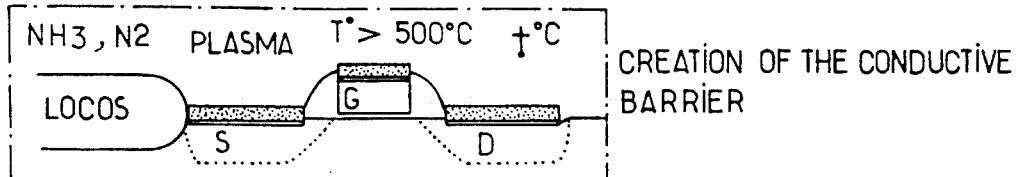
FIG. 1C — CREATION OF THE CONDUCTIVE BARRIER
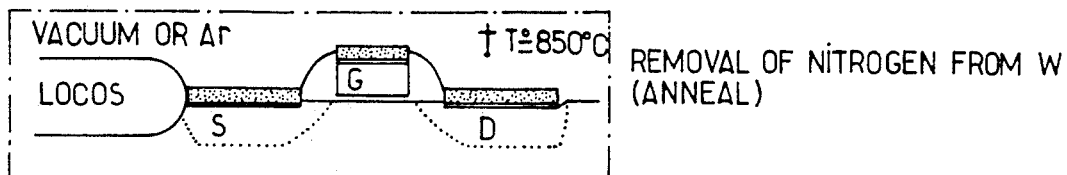
FIG. 1D — REMOVAL OF NITROGEN FROM W (ANNEAL)

PROCESS FOR PRODUCING AN ELECTRICALLY CONDUCTIVE DIFFUSION BARRIER AT THE METAL/SILICON INTERFACE OF A MOS TRANSISTOR

BACKGROUND OF THE INVENTION

In the technical field of the manufacture of integrated circuits, especially of MOS transistors, it is increasingly necessary to stabilise the physico-chemical properties of the various zones of these integrated circuits, especially at the level of the metal contact/semiconductor material interfaces.

Among recent developments in this technical field, it has been proposed to use, as contact metal, intended for providing the electrical contacts with the source, gate and drain zones of these transistors, a metal such as tungsten. The provision of the corresponding metal onto the gate, source or drain zones is usually carried out by means of a metallisation by selective deposition of tungsten using vapour phase chemical deposition.

Such a technique has numerous advantages, the abovementioned selective deposition being easy to perform, implementing the usual operational precautions, by means of appropriate machines such as industrial machines marketed in France by the companies SPECTRUM and TEGAL.

Furthermore, the abovementioned vapour phase deposition produces no uncontrolled consumption of silicon during the operation of the latter.

Tungsten itself has an excellent resistivity value, of the order of 8 $\mu\Omega$.cm, which justifies the choice of the latter so as to produce the electrical connections of the various zones of the transistor or corresponding integrated circuit.

This material also gives a high degree of conformity to the covering of the abovementioned zones, which results in a good mechanical and electrical homogeneity of the corresponding electrical contacts.

However, although the metal/silicon interface constitutes a good diffusion barrier when the chosen deposition metal is tungsten, between the tungsten and silicon molecules, the same does not apply however when this chosen metal is subjected to high temperatures, and this substantially reduces the advantage in such a choice.

The major drawback in the choice of tungsten appears to be the reactivity of this metal with silicon in order to form a tungsten silicide $WSi_2$ at a temperature above 700° C. The consequence is an increase in the resistivity and the resistance of the connection contact and a consumption in silicon from the junctions of the corresponding zones by creating a rough $WSi_2/Si$ interface. In particular, it will be noted that recent studies, see Vacuum Technology Industrial Research & Development—March 1983 p 141-147, report a certain stability of the structure Al/W/Si, the latter is however limited to a temperature of the order of 500° C.

Such stability may be sufficient for a single metal integrated circuit, that is to say having a single level of interconnection, but it may not be suitable for modern double metal integrated circuits where the W/Si interface is at 950° C., especially during the flowing stage of the intermetallic dielectric.

SUMMARY OF THE INVENTION

The object of the present invention is to overcome the abovementioned drawbacks by operating a process for producing an electrically conductive diffusion barrier at the metal/silicon interface of an MOS transistor.

Another object of the present invention is the operation of this process more particularly in the case where the metal used is tungsten.

A further object of the present invention is finally the operation of an MOS-type transistor comprising, at the level of the metal/silicon interface of the contacts of the source, drain and gate zones, an electrically conductive diffusion barrier.

The process for producing an electrically conductive diffusion barrier at the metal/silicon interface of an integrated circuit which forms the subject of the invention, is noteworthy in that following a selective deposition of metal intended to constitute the interface, the process consists in subjecting this interface to a nitrogen-based plasma during a period of at least five minutes and in bringing the interface to a temperature greater than 500° C. during this period, in such a way as to create, at the level of the interface, a silicon nitride layer forming the diffusion barrier. The combination constituted by the interface and by the diffusion barrier is subjected to an annealing treatment, under a neutral atmosphere, so as to remove the nitrogen introduced into the metal in the course of the preceding step.

The MOS transistor of the integrated-circuit type comprising, on a substrate of n- or p-type silicon, a source zone, a gate zone and a drain zone of opposite type, p or n, each of the zones comprising, at its free surface, a layer of metal, forming the said MOS transistor and its contacts, is noteworthy in that this transistor comprises, at the level of the source, gate or drain zones, respectively, an electrically conductive diffusion barrier made of silicon nitride, the said diffusion barrier forming a linking and protecting interface between each source, drain or gate zone and the corresponding layer of metal covering the latter.

The process, subject of the invention, and the corresponding transistor find application in the field of the integrated-circuit industry.

BRIEF DESCRIPTION OF THE DRAWINGS

A more detailed description of the process and of the MOS-type transistor which form the subject of the invention, will be given by reading the description and by observation of the drawings in which:

FIGS. 1A–1D show the essential steps of the operation of the process which forms the subject of the invention.

DESCRIPTION OF THE PREFERRED EMBODIMENT

Figure 2:
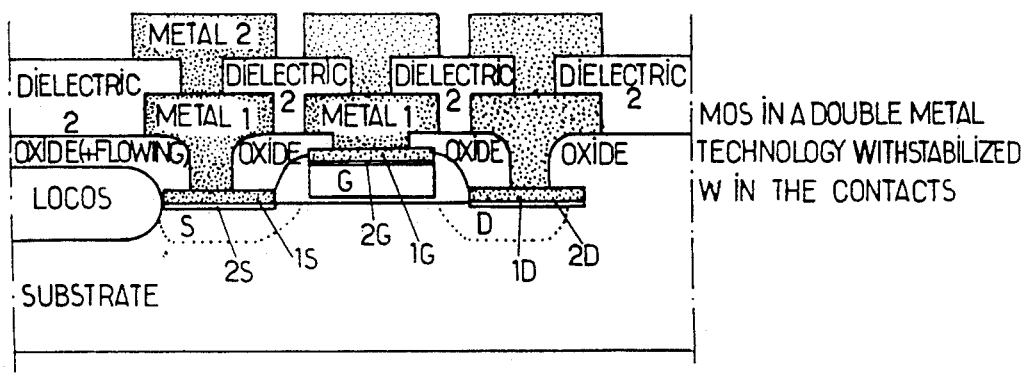
FIG. 2 shows a view, in cross-section, of a double metal MOS transistor in accordance with the subject of the present invention.

A more detailed description of a method of operating the process for producing an electrically conductive diffusion barrier at the metal/silicon interface of an MOS transistor which forms the subject of the present invention, will now be given in conjunction with FIG. 1.

In the abovementioned FIG. 1, in particular at point a) of the latter, has been shown, in cross-section, a view of an MOS transistor and the regions constituting the latter. There is recognised, in particular for the integrated circuit constituting the abovementioned MOS transistor in a silicon substrate of n or p type, the existence of a source zone S, of a gate zone G, this gate being of the gate type isolated by the agency of an SiO$_2$-type isolation and of a drain zone D. It will be noted that the source and drain zones are of semiconductor type opposite to the substrate type, these zones being of p-or n-doped type, respectively. At point a) of FIG. 1 has been shown, in fact, the abovementioned crosssectional view prior to the selective deposition of the metal intended for producing, on the zones of the above-mentioned MOS transistor, the corresponding contacts.

In a general, non-limiting manner, it will be taken that the metal chosen for carrying out the deposition is tungsten, W.

At point b) of the same FIG. 1, has been shown the same MOS transistor following the selective deposition of the metal, that is to say of tungsten, this selective deposition taking place, of course, on the previously mentioned corresponding zones, that is to say on the silicon zones and not on the SiO$_2$ isolation zones. The abovementioned metallic depositions then constitute the contacts of the source S, gate G and drain D zones.

Thus, each metallic deposition on the corresponding source, gate or drain zone constitutes a metal/silicon-type interface.

In accordance with the process which forms the subject of the invention, and as shown especially in FIG. 1, at point c), the latter then consists in subjecting the abovementioned interface to a nitrogen-based plasma during a period of at least five minutes and in bringing the previously mentioned interface to a temperature greater than 500° C. during this period. Such an operating mode makes it possible to create, at the level of the abovementioned interface, a silicon nitride layer forming the desired conductive diffusion barrier.

By way of non-limiting example, there is represented, in FIG. 1 at point c) of the latter, the integrated circuit previously represented at point b) placed in a plasma furnace, the combination of the substrate and the metal/silicon interfaces to be treated being maintained at a temperature greater than 500° C. by heating means (not shown). Of course, the plasma is created conventionally, this plasma essentially being constituted from a nitrogen base.

It will be noted, of course, that the above-mentioned plasma may be constituted by a pure nitrogen plasma, N$_2$, but this plasma may also be constituted by an ammonia plasma, NH$_3$.

The previously mentioned plasmas may be produced in plasma furnaces normally available on the market and the operating conditions of such plasma furnaces will not be described for this reason.

It will be merely noted that, in the case of the operation of a pure nitrogen plasma, N$_2$, the metal/silicon interface of the MOS transistor in question to be treated is subjected to a nitrogen plasma such as mentioned previously during a period of ten minutes for example. The interface is then furthermore brought, during this period, to a temperature of 700° C. for example, in order to generate a silicon nitride layer forming the diffusion barrier of a thickness preferably equal to 2 nm.

After the step represented by point c) of FIG. 1, the process of the invention then consists in subjecting the combination constituted by the interface and by the diffusion barrier at the level of each of the zones of the MOS transistor in question to an annealing treatment under a neutral atmosphere, so as to remove the nitrogen introduced into the metal in the course of the preceding step c).

Of course, it will be understood that because the annealing treatment is essentially intended to effect a removal of nitrogen from the metal deposited on each of the zones of the MOS transistor in question, in particular from the tungsten when this metal has been chosen, the neutral atmosphere may be constituted by any non-oxidising gaseous atmosphere with the exception of nitrogen. It will then be possible to place the integrated circuit in question, as represented at point d) of FIG. 1, in a sealed enclosure, for example a sealed oven, in which an argon atmosphere for example will have been introduced under low pressure. Furthermore, and in a non-limiting manner, the neutral atmosphere may simply be produced by vacuum. It will be noted, in particular, that the latter solution appears advantageous in so far as the removal of nitrogen may thus be carried out under completely satisfactory conditions, the nitrogen removal gas thus being absorbed by the system for placing the sealed enclosure under vacuum, this system not being represented in FIG. 1.

In the case of point d) of FIG. 1, the annealing temperature may be chosen to be equal to 850° C., for example.

It will be noted that the process which forms the subject of the invention, such as described previously in relation to FIG. 1, thus enables a layer of silicon nitride Si$_3$N$_4$ of the order of two nanometers to be created, this layer preventing the diffusion of silicon into the metal and, in particular, into the tungsten, W, which has the effect of preventing the formation of tungsten silicide or of metal silicide. Furthermore, the layer forming a diffusion barrier, the layer of silicon nitride Si$_3$N$_4$, is sufficiently thin in order to be electrically conductive without adversely increasing the resistivity and the total resistance of the metal/silicon interface. It will be noted, in fact, that the vacuum annealing treatment, for example at 850° C., as was described previously, subsequently enables the nitrogen introduced into the metal, i.e. tungsten, to be removed which then enables the latter to recover its initial resistivity.

It will be noted that the process which forms the subject of the present invention, is particularly advantageous in so far as the latter does not use an additional mask.

It will be noted that the process which forms the subject of the present invention, may be operated by means of the industrial machine designated by the name URANOS, such a machine enabling the process which forms the subject of the invention, to be carried out and to be operated in a particularly well-suited manner. For a more complete description of such a machine, it will be possible to refer to European Patent Application no. EP 84,402,319.

Finally, it will be noted that the embodiment such as described previously in connection with FIG. 1 of the process which forms the subject of the invention, corresponds to experimental conditions established for the treatment of a metal/silicon interface for which the thickness of deposited metal, such as tungsten, corresponds to a thickness of the order of 100 nm.

A more detailed description of an MOS transistor of the integrated-circuit type in accordance with the subject of the present invention will be given in connection with FIG. 2.

According to the abovementioned figure, the latter representing such an MOS transistor along a crosssectional view in the plane of alignment of the source, gate and drain zones, comprises, on a silicon substrate of n or p type, a source zone S, a gate zone G, isolated by the agency of a support made of silicon oxide $SiO_2$, and a drain zone D, the source S and drain D zones being of semiconductor type, p or n type, opposite to that of the substrate. Each zone comprises at its free surface a metal layer denoted b 1S, 1G, 1D, each corresponding, respectively, to the source, gate, and drain zones, the combination constituting the MOS transistor and its connections. The term LOCOS designates a zone made of silicon oxide $SiO_2$.

As has been further represented in FIG. 2, the transistor which forms the subject of the invention, comprises, at the level of the source S, gate G and drain D zones, an electrically conductive diffusion barrier denoted, respectively, for each of the zones by 2S, 2G and 2D. Each electrically conductive diffusion barrier is made of silicon nitride and thus forms a linking and protecting interface between each source S, drain D or gate G zone and the corresponding metal layer 1S, 1D, 1G covering the latter.

Preferably, and in a non-limiting manner, the electrically conductive diffusion barrier 2S, 2D, 2G, has a thickness of the order of two nanometers.

It will be noted, in a non-limiting advantageous manner, that the metal providing the contacts and constituting the metal/silicon interface may then be chosen advantageously as constituted by tungsten, which, of course, makes it possible to use the remarkable properties of this metal which were previously mentioned in the description in order to produce the contact zones.

Of course, it will be noted that in the case of FIG. 2, the MOS transistor represented is a double metal transistor, that is to say a transistor comprising two levels of metallisation in order to produce the contacts, these two levels of metallisation being designated, respectively, metal 1, metal 2 in FIG. 2 and thus being superposed at the connection interfaces denoted, respectively, by 1S, 2S, 1G, 1G, 1D, 2D. Of course, and in a conventional manner, the silicon oxide intended for isolating the metallic levels or parts, metal 1, metal 2, of the two levels of metallisation is conventionally brought about by flowing. The process which forms the subject of the invention, thus makes it possible to produce double metal integrated circuits with tungsten connection in which the tungsten/silicon interface is subjected to temperatures of the order of 750° C. to 950° C. in particular during the step of flowing of the intermetallic dielectric or the corresponding silicon oxide without thereby causing the W/Si migration to form tungsten silicide above a temperature of 700° C.

Finally, it will be noted that the process which forms the subject of the present invention, is particularly advantageous, moreover, in so far as the latter is distinguished from other processes of the prior art in which, so as to alleviate the abovementioned drawback, it has been proposed to deposit an intermediate layer of titanium nitride, such a process, especially, appearing from a poorly suited operation in so far as this process requires the use of an additional mask.

We claim:
1. A method for producing an electrically conductive diffusion barrier at a metal/silicon interface of an integrated circuit in which, following a selective deposition of metal onto silicon to form the metal/silicon interface, the method comprises the steps of:
   subjecting the interface to a nitrogen-based plasma during a period of at least five minutes;
   adjusting the temperature of the interface to greater than 500° C. during said step of subjecting to form a diffusion barrier comprising a silicon nitride layer at the interface; and
   annealing the interface and the diffusion barrier under a neutral atmosphere to remove nitrogen introduced into the metal during the steps of subjecting and adjusting.
2. The method according to claim 1, wherein the step of subjecting comprises subjecting the interface to a pure nitrogen plasma.
3. The method according to claim 1, wherein the step of subjecting comprises subjecting the interface to an ammonia plasma.
4. The method according to claim 1, wherein the step of subjecting is performed for a period of ten minutes, and the step of adjusting comprises adjusting the temperature of the interface to 700° C. in order to form a diffusion barrier having a thickness of 2 nanometers.
5. The method according to claim 1, wherein the step of annealing is performed under vacuum and comprises adjusting the temperature of the interface and the diffusion barrier to approximately 850° C.

* * * * *